(12) United States Patent
Shinomiya et al.

(10) Patent No.: US 8,922,997 B2
(45) Date of Patent: Dec. 30, 2014

(54) ELECTRIC POWER CONVERSION DEVICE

(71) Applicant: Hitachi, Ltd., Chiyoda-ku, Tokyo (JP)

(72) Inventors: Takeshi Shinomiya, Hitachinaka (JP);
Yuichiro Nozaki, Hitachinaka (JP);
Masafumi Makino, Tokyo (JP);
Masaomi Konishide, Tsuchiura (JP);
Yasuhiko Kono, Hitachinaka (JP);
Tetsuo Kojima, Hitachinaka (JP); **Tetsu
Sugiura**, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 310 days.

(21) Appl. No.: 13/652,584

(22) Filed: Oct. 16, 2012

(65) Prior Publication Data

US 2013/0094150 A1    Apr. 18, 2013

(30) Foreign Application Priority Data

Oct. 18, 2011    (JP) .................................. 2011-228463

(51) Int. Cl.
| | |
|---|---|
| *H05K 7/20* | (2006.01) |
| *H05K 5/02* | (2006.01) |
| *H02M 7/487* | (2007.01) |
| *H02M 7/00* | (2006.01) |

(52) U.S. Cl.
CPC .............. *H02M 7/487* (2013.01); *H02M 7/003* (2013.01); *H05K 7/209* (2013.01)
USPC ............................. 361/690; 361/707; 363/141

(58) Field of Classification Search
CPC ........... H05K 7/20672; H05K 7/20563; H01L 23/467; H01L 33/64; G06F 1/20
See application file for complete search history.

(56) References Cited

U.S. PATENT DOCUMENTS

| | | | |
|---|---|---|---|
| 5,801,936 A * | 9/1998 | Mori et al. ...................... | 363/132 |
| 6,028,779 A | 2/2000 | Sakamoto et al. | |
| 6,272,028 B1 * | 8/2001 | Satoh et al. ................. | 363/56.05 |
| 6,768,193 B2 * | 7/2004 | Nakamura et al. ............ | 257/707 |
| 7,978,488 B2 * | 7/2011 | Tanaka et al. ................. | 363/141 |
| 2003/0090873 A1 * | 5/2003 | Ohkouchi ..................... | 361/704 |

FOREIGN PATENT DOCUMENTS

| | | |
|---|---|---|
| EP | 1887683 | 2/2008 |
| JP | 4-368464 | 12/1992 |
| JP | 2003-79162 | 3/2003 |

OTHER PUBLICATIONS

O. Deblecker et al., Comparative Analysis of Two Zero-Current Switching Isolated DC-DC Converters for Auxiliary Railway Supply, IEEE Trans. on Power Electronics, Sep. 2008, vol. 23, No. 5.

* cited by examiner

*Primary Examiner* — Gregory Thompson
(74) *Attorney, Agent, or Firm* — Antonelli, Terry, Stout & Kraus, LLP.

(57) ABSTRACT

Semiconductor element groups constituting a unit are mounted on a cooler heat receiving part 1 on the same plane and are adapted to radiate heat by self-cooling or cooling by wind. First and fourth semiconductor elements Q1, Q4 are arranged on the lower side of the cooler heat receiving part, second and third semiconductor elements Q2, Q3 are arranged in the middle, a first diode D5 and a second diode D6 are arranged on the upper side, the first and second semiconductor elements Q1, Q2, as well as the third and fourth semiconductor elements Q3, Q4 are each arranged in positions opposite to each other in a horizontal direction with respect to a centerline of a cooler in a vertical direction.

5 Claims, 11 Drawing Sheets

FIG. 7
CONVENTIONAL EXAMPLE 1

FIG. 8 CONVENTIONAL EXAMPLE 2

ELECTRIC POWER CONVERSION DEVICE

The present application is based on and claims priority of Japanese patent application No. 2011-228463 filed on Oct. 18, 2011, the entire contents of which are hereby incorporated by reference.

BACKGROUND OF INVENTION

1. Field of the Invention

The present invention relates to an electric power conversion device and, in particular, to a method of element arrangement in a cooler of an electric power conversion device using semiconductor elements which is installed in railroad rolling stock.

2. Description of the Related Art

An electric power conversion device is generally composed of semiconductor elements and includes inverter circuits which convert a dc power source to an alternating current, converter circuits which convert an ac power source to a direct current, and the like. Inverter circuits include a variable voltage variable frequency (VVVF) inverter circuit which controls the voltage and frequency of an ac output in variable manner. The VVVF inverter circuit is frequently used in an electric power conversion device.

For example, in dc electric rolling stock of a railroad rolling stock system, a VVVF inverter circuit is generally used as an electric power conversion device, and controls an ac induction motor by converting a direct current to a three-phase alternate current of variable voltage variable frequency. In ac electric rolling stock, a single-phase ac power source is temporarily converted to a direct current by a converter circuit, the dc power source is converted to a three-phase alternating current of variable voltage variable frequency by an inverter circuit, and an ac induction motor is driven.

In the case where an instable dc power source is stabilized or dc voltage is converted to an arbitrary value for use, or in the case where it is necessary to output a dc power source electrically insulated from input, a DC-DC converter circuit is used and an electric power conversion device is used also in the converter circuit.

In a conversion circuit part of such an electric power conversion device using the semiconductor elements, heat is generated due to heat generation losses occurring during the switching of the semiconductor elements and during the flow of a current to the semiconductor elements. Consequently, the heat is discharged to outside the electric power conversion device by a cooler, whereby the temperature of the semiconductor elements is kept at not more than a permissible value thereof. A cooler used in an electric power conversion device is basically composed of a heat receiving part on which semiconductor elements are mounted and a heat radiating part which radiates heat to the ambient air. The heat receiving part is placed in a sealed chamber portion of the electric power conversion device, whereas the heat radiating part is placed in an open chamber portion in communication with the ambient air.

Incidentally, in the DC-DC converter described above, there are known methods in which the applied frequency is increased to reduce the size of an insulation transformer, and among others, techniques based on a method by which switching losses are reduced through the use of a resonance circuit (soft switching) are described in Japanese Patent Laid-Open Publication No. 4-368464 and O. Deblecker, A. Moretti, and F. Vallee: "Comparative Analysis of Twozero-Current Switching Isolated DC-DC Converters for Auxiliary Railway Supply," SPEEDAM2008.

Figure 7:
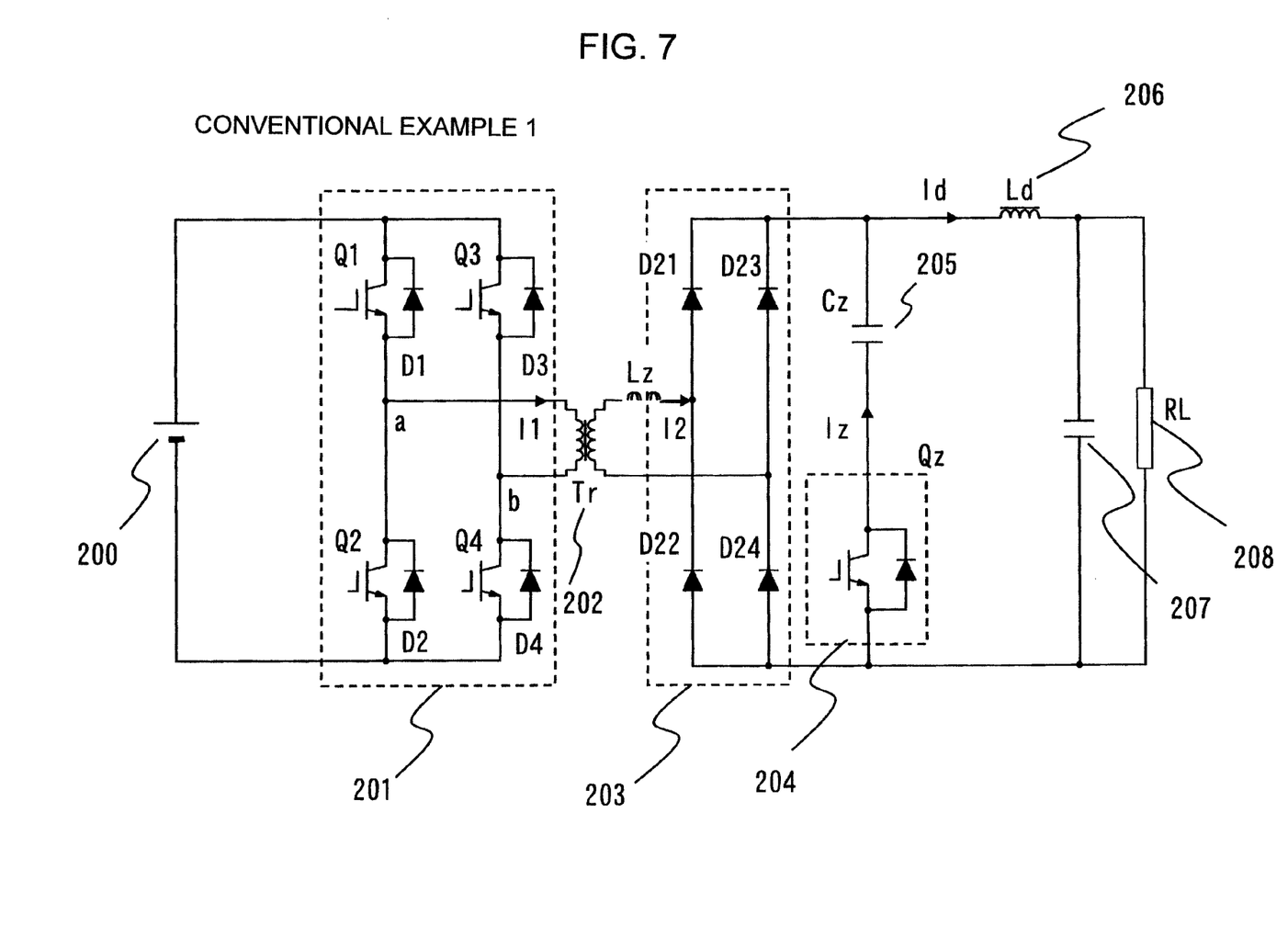
FIG. 7 is a diagram showing the configuration of an electric circuit of a conventional technique (Japanese Patent Laid-Open Publication No. 4-368464 and O. Deblecker, A. Moretti, and F. Vallee: "Comparative Analysis of Twozero-Current Switching Isolated DC-DC Converters for Auxiliary Railway Supply," SPEEDAM2008)

This circuit configuration is shown in FIG. 7. The DC-DC converter shown in FIG. 7 is composed of a dc voltage source 200, a converter 201 which converts the dc power of the dc voltage source 200 to ac power, a transformer 202 which inputs the ac power outputted by the converter 201, a rectifying circuit 203 which converts the ac power outputted by the transformer 202 to dc power, a resonance circuit composed of a resonance switch 204 and a resonance capacitor 205 which are connected in parallel on the dc output side of the rectifying circuit 203, a filter reactor 206 and a filter capacitor 207 which smooth the dc power outputted by the rectifying circuit 203, and a load 208 connected in parallel to the filter capacitor 207.

The DC-DC converter activates the resonance switch 204 in synchronization with the timing of turning-off of the converter 201 and superimposes a resonance current Iz on a secondary current I2, thereby temporarily enabling the secondary current I2 to be reduced to zero and a primary current I1 to be reduced to the level of only an exciting current of the transformer 202. It is possible to substantially reduce turning-off losses of the converter 201 by turning off the converter 201 in synchronization with this timing.

In the DC-DC converter shown in FIG. 7, the primary current I1 and the secondary current I2 are zero while the semiconductor elements Q1 to Q4 constituting the converter 201 are off, but a returning current continues to flow through the diodes constituting the rectifying circuit 203. When the semiconductors Q1, Q4 constituting the converter 201 are turned on from this state, the primary current I1 and the secondary current I2 begin to flow and the magnitude of the secondary current I2 becomes equal to that of a load current Id. At this time, a current of the same magnitude as the secondary current I2 flows through a half number of the diodes constituting the rectifying circuit 203, and the current in the remaining half number of the diodes becomes zero.

Figure 2:
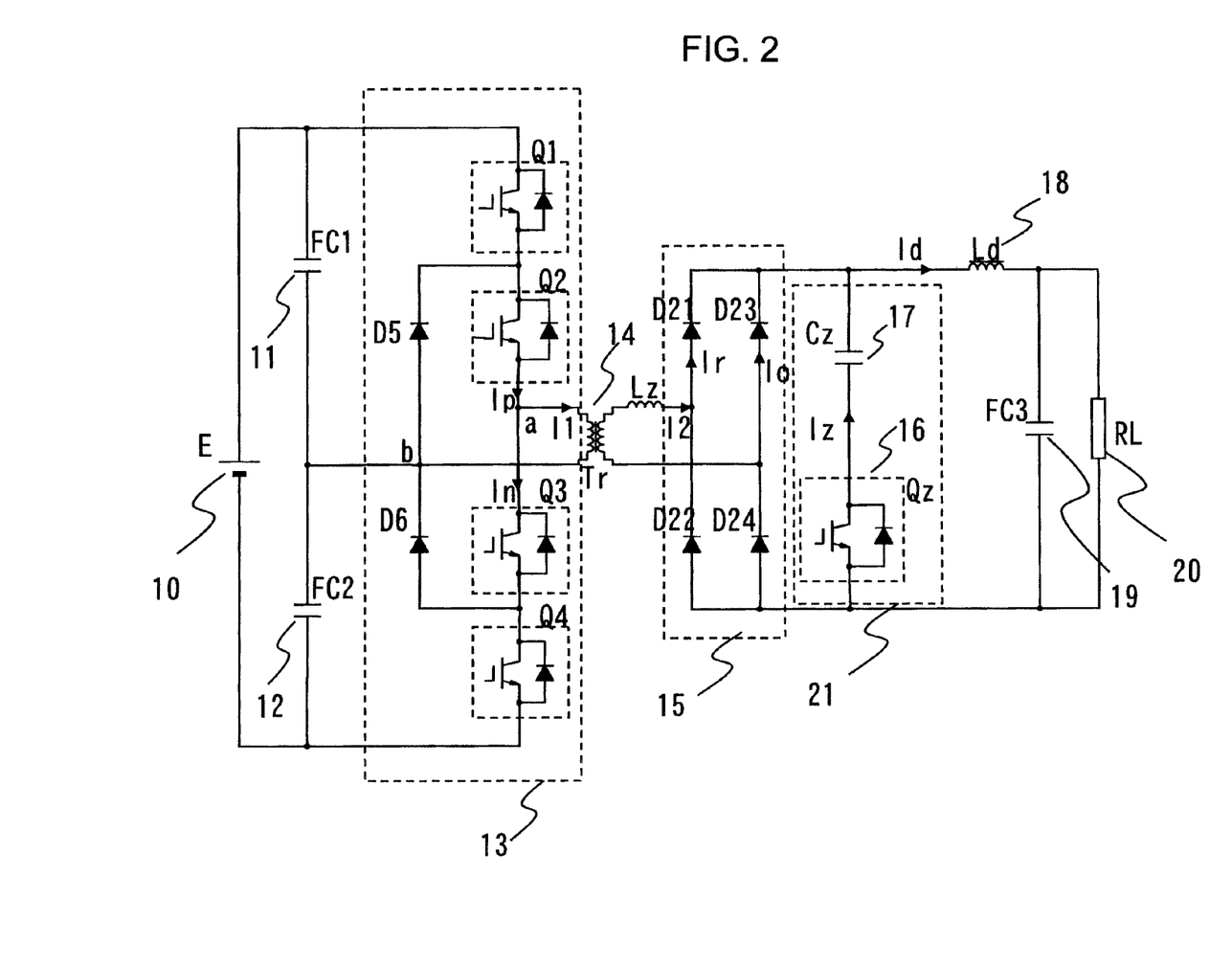
FIG. 2 is a diagram showing an electric circuit configuration in the present invention.

FIG. 2 shows an embodiment of a circuit in which the converter portion of the circuit is used as a three-level circuit. A DC-DC converter 13 is composed of a dc voltage source 10, a filter capacitor 11 (FC1) and a filter capacitor 12 (FC2) which are connected in parallel to the dc voltage source 10, a converter 13 which converts the dc power of the filter capacitor 11 and the filter capacitor 12 to ac power, a transformer 14 which inputs the ac power outputted by the converter 13, a rectifying circuit 15 which converts the ac power outputted by the transformer 14 to dc power, a resonance switch 16 (Qz) which is connected in parallel to the dc output side of the rectifying circuit 15, a resonance circuit 21 composed of a resonance capacitor 17, a filter reactor 18 and a filter capacitor 19 which smooth the dc power outputted by the rectifying circuit 15, and a load 20 connected in parallel to the filter capacitor 19.

The DC-DC converter shown in FIG. 2 activates the resonance switch 16 in synchronization with the timing of turning-off of the converter 13 and superimposes a resonance current Iz on a secondary current I2 of the transformer 14, thereby temporarily enabling the secondary current I2 to be reduced to zero and a primary current I1 to be reduced to the level of only an exciting current of the transformer 14. It is possible to substantially reduce turning-off losses of the converter 13 by turning off the converter 13 in synchronization with this timing.

In the DC-DC converter shown in FIG. 2, the primary current I1 and the secondary current I2 are zero while the semiconductor elements Q1 to Q4 constituting the converter 13 are off, but a returning current continues to flow through the diodes constituting the rectifying circuit 15. When the semiconductors Q1 and Q2 or Q3 and Q4 constituting the converter 13 turning-on from this state, the primary current I1 and the secondary current I2 begin to flow and the magnitude of the secondary current I2 becomes equal to a load current Id. At this time, a current of the same magnitude as the secondary current I2 flows through a half number of the diodes constituting the rectifying circuit 15, and the current in the remaining half number of the diodes becomes zero.

In the converter 13 of three-level circuit which acts in this way, the level of heat generation of the semiconductor elements is in decreasing order semiconductor elements Q1, Q4>semiconductor elements Q2, Q3>clamp diodes D5, D6. In the semiconductor elements Q1 to Q4, there are losses caused by the conduction of a load current Id in an on state and switching losses occurring at turning on and turning off. On the other hand, because only currents flowing in the clamp diodes D5, D6 are resultant from commutating actions caused by switching and losses are small, the calorific value is also small compared with the semiconductor elements Q1 to Q4. The reason why there is a difference in calorific value between the semiconductor elements Q1, Q4 and the semiconductor elements Q2, Q3 is that the semiconductor elements Q1, Q4 are turned off with the primary current I1 on the order of an exciting current of the transformer 14, whereas the semiconductor elements Q2, Q3 are turned off with the current zero, with the result that there is a difference, in particular, in the magnitude of switching losses by turning-off, leading to a difference in the calorific value between the them. A more detailed reason will be given in the embodiments which will be described later.

At this time, by arranging the semiconductor elements Q1, Q4 having large heat generation in places where the cooler has large cooling performance as far as possible and where the semiconductor elements Q1, Q4 are not affected by other heat generating elements placed on the same plane of the cooler, the cooling performance can be utilized to a maximum degree, with the result that it becomes possible to reduce the size and weight of the cooler.

For this reason, regarding an electric power conversion device having a three-level converter circuit using semiconductor elements which is installed under the floor of railroad rolling stock, for example, Japanese Patent Laid-Open Publication No. 2003-79162 describes an arrangement method for semiconductor elements and diodes to be cooled on one cooler 110 (a heat receiving potion) in an electric power conversion device.

Figure 8:
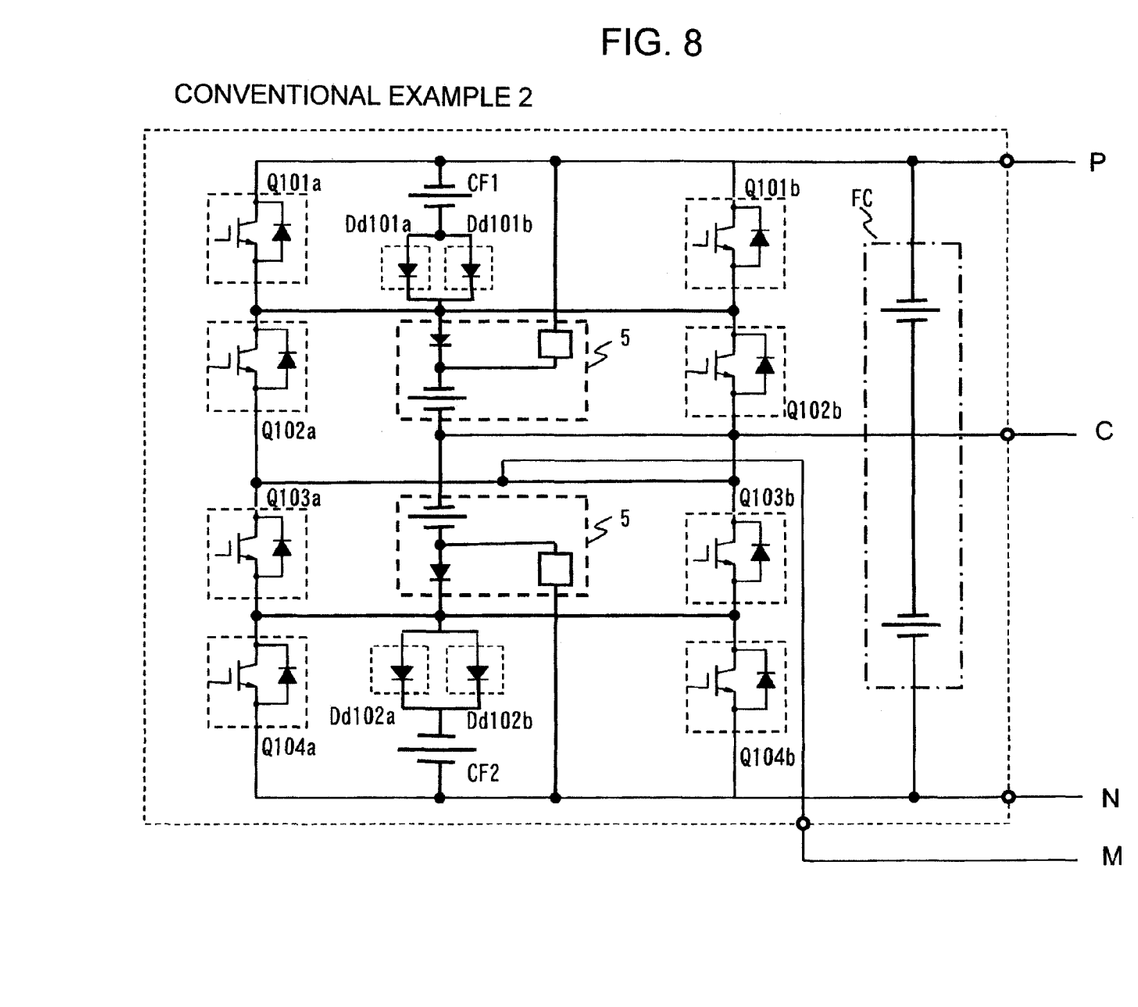
FIG. 8 is a diagram showing the configuration of an electric circuit of a conventional technique (Japanese Patent Laid-Open Publication No. 2003-79162)

FIG. 8 is a circuit diagram showing an example of one phase portion of a converter circuit 2 described in Japanese Patent Laid-Open Publication No. 2003-79162. The converter circuit is composed of an a-system and a b-system of a 2-system parallel configuration. First, the a-system is configured in such a manner that between a dc positive terminal P and a dc negative terminal N, four semiconductor elements composed of a first semiconductor element Q101a to a fourth semiconductor element Q104a are connected in series and a first diode Dd101a and a second diode Dd102a are connected in series. Similarly, also the b-system is configured in such a manner that between the dc positive terminal P and the dc negative terminal N, four semiconductor elements composed of a first semiconductor element Q101b to a fourth semiconductor element Q104b are connected in series and a first diode Dd101b and a second diode Dd102b are connected in series.

Capacitors CF1, CF2 are connected to the series circuits of the first diodes Dd101a, Dd101b and the second diodes Dd102a, Dd102b, and snubber circuits 5 are provided. An ac terminal M is connected to a connection point of the second semiconductor element Q102 and the third semiconductor element Q103, and a neutral terminal C is connected to a connection point of a first diode Dd101 and a second diode Dd102. A filter capacitor FC is connected to between the dc positive terminal P and the dc negative terminal N.

Figure 9:
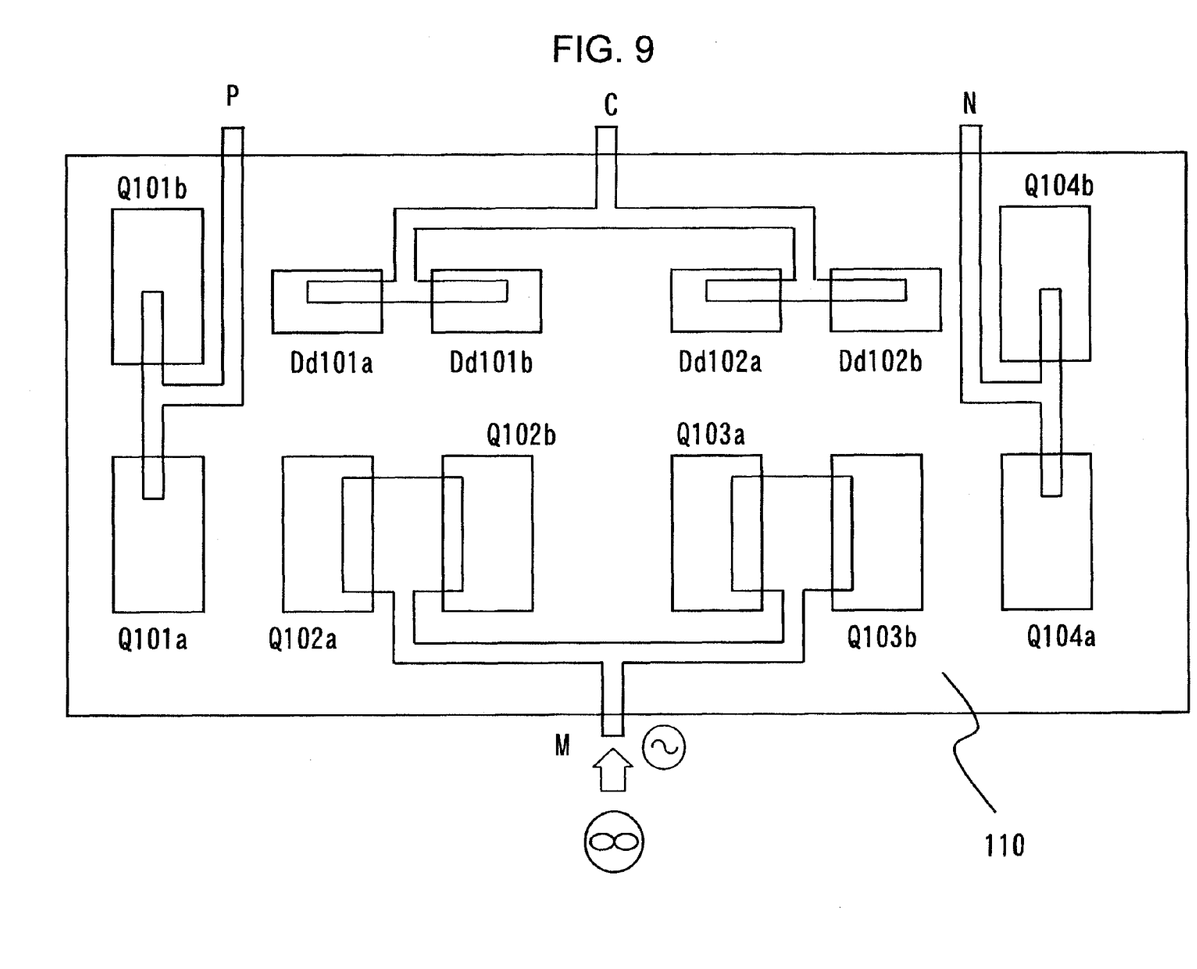
FIG. 9 is a diagram showing an example of the element arrangement of the conventional technique (Japanese Patent Laid-Open Publication No. 2003-79162)

FIG. 9 shows an embodiment of the element arrangement of Japanese Patent Laid-Open Publication No. 2003-79162. The order of magnitude of heat generation losses of each element shown in FIG. 9 is in decreasing order semiconductor elements Q102a (Q102b), Q103a (Q103b)>semiconductor elements Q101a (Q101b), Q104a (Q104b)>clamp diodes Dd101a (Dd101b), Dd102a (Dd102b). As shown in FIG. 9, on the heat receiving part of the cooler 110, the second and third semiconductor elements Q102a (Q102b), Q103a (Q103b) having large heat generation losses are arranged on the windward side of the cooling wind, as well as the first and second diodes Dd101a (Dd101b), Dd102a (Dd102b) and the first and fourth semiconductor elements Q101a (Q101b), Q104a (Q104b), which have small heat generation losses, are arranged on the leeward side of the cooling wind for Q102a (Q102b) and Q103a (Q103b). With this arrangement, it is possible to increase the efficiency of the cooling performance, as a result of which, this arrangement advantageously reduces the size of the cooler 110.

Figure 10:
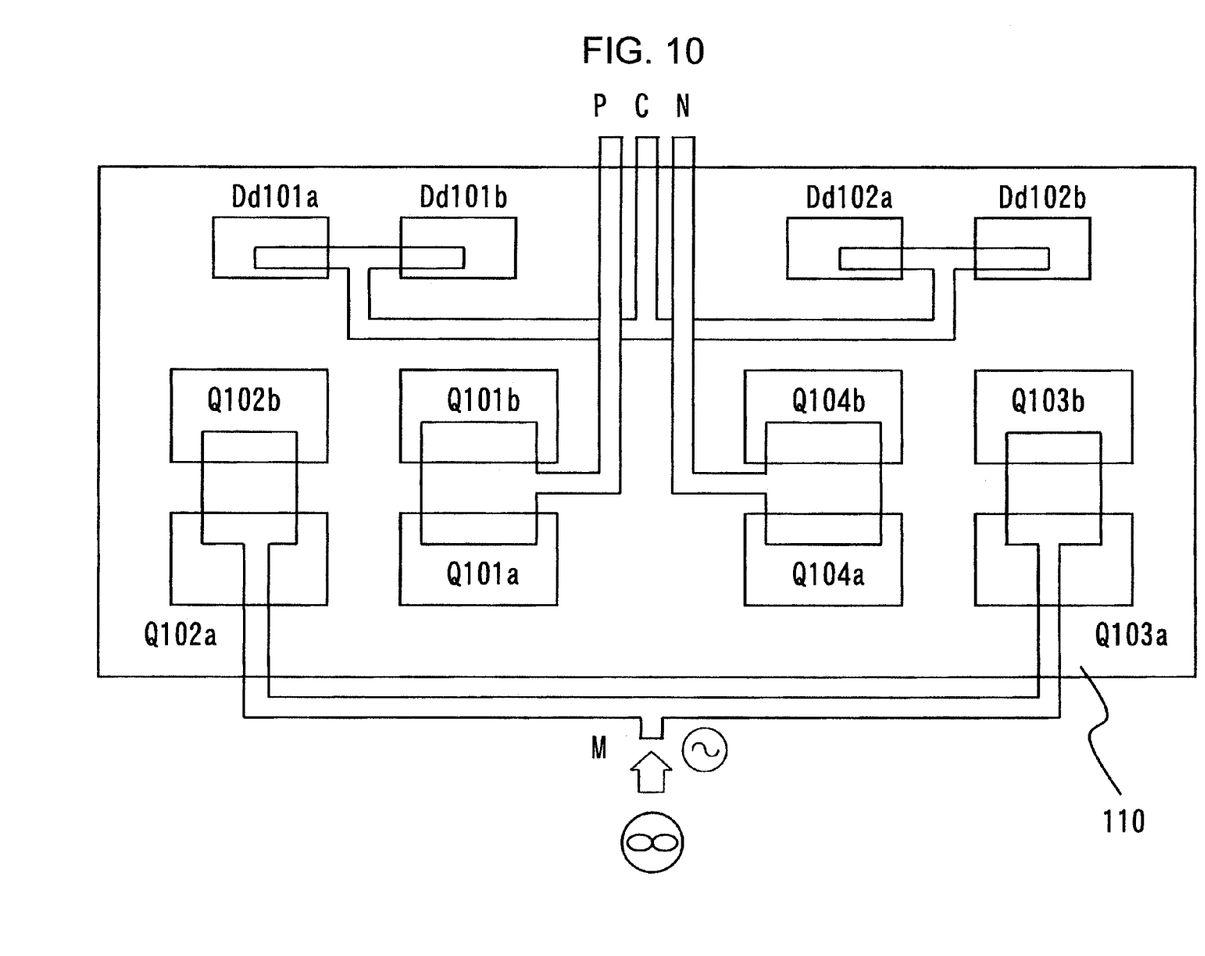
FIG. 10 is a diagram showing the second embodiment of the element arrangement of the conventional technique (Japanese Patent Laid-Open Publication No. 2003-79162)

However, this arrangement increases the lateral dimension of the cooler 110 (i.e., the dimension in the direction orthogonal to the cooling wind), and in the case where an electric power conversion device is installed under the floor of railroad rolling stock, the dimension of the cooler 110 in the rail direction increases and a large installation space may sometimes be required. There is the configuration shown in FIG. 10 as an example in which in order to reduce the lateral dimension of the cooler 110, the components are arranged in a multi-stage configuration. Semiconductor elements Q101a to Q104a, Q101b to Q104b having large heat generation are arranged on the windward side, whereas clamp diodes Dd101a (Dd101b), Dd102a (Dd102b) having small heat generation are arranged on the leeward side.

Figure 11:
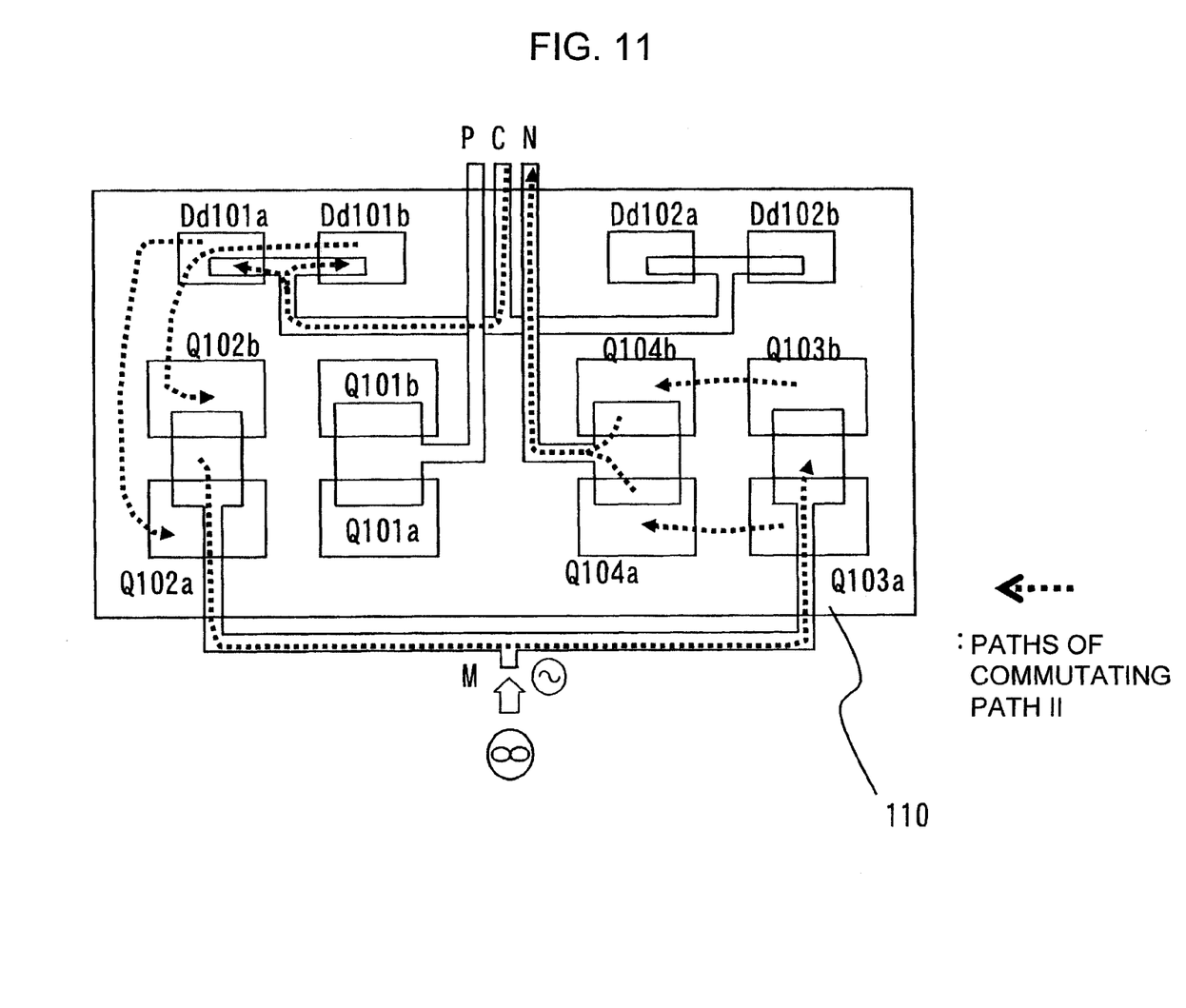
FIG. 11 is a diagram showing an example of the commutating path on the element arrangement of the conventional technique (Japanese Patent Laid-Open Publication No. 2003-79162).

However, the invention of Japanese Patent Laid-Open Publication No. 2003-79162 above has a problem described below. The problem is described below with the aid of FIG. 11. FIG. 11 shows the current paths indicated by PATH II of FIG. 3. It is apparent the current paths assume a large loop that increases the path length. For this reason, the problem with the invention is that the parasitic inductance of the circuit becomes large and that the overvoltage occurring in the parasitic inductance at the turning-off of the semiconductor elements is applied to the elements, causing a damage to the semiconductor elements.

For this problem, in Japanese Patent Laid-Open Publication No. 2003-79162, a measure which involves insertion of the snubber circuits 5 is taken to suppress a rise in the voltage of the semiconductor elements. However, this measure results in an increase in the size and weight of the device due to an increased number of parts and a decrease in the reliability of the device due to an increased risk of troubles in the parts.

The present invention is intended for solving the above-described problem and the object of the present invention is, in an electric power conversion device in which the cooling performance of a cooler is improved by making the most of a difference in heat generation from semiconductor elements, to improve the reliability of the electric power conversion device by suppressing the overvoltage applied to the elements without the need to add snubber circuits by reducing parasitic inductance.

SUMMARY OF THE INVENTION

In order to solve the above-described problem, the electric power conversion device of the present invention is such that semiconductor element groups constituting an electric power conversion part are formed as one unit; a main circuit of the above-described electric power conversion part is such that four semiconductor elements of a first semiconductor element to a fourth semiconductor element are connected in series between a dc positive terminal and a dc negative terminal, and a first diode and a second diode are connected in series; an ac terminal is connected to a connection point of a second semiconductor element and a third semiconductor element and a neutral terminal is connected to a connection point of the above-described first diode and the above-described second diode; the above-described first diode is connected to a connection point of the above-described first semiconductor element and the above-described second semiconductor element and the above-described second diode is connected to a connection point of the above-described third semiconductor element and the above-described fourth semiconductor element; and the above-described semiconductor element groups constituting the above-described one unit are mounted on a cooler heat receiving part on the same plane and are adapted to radiate heat by self-cooling or forced cooling by wind. In this electric power conversion device, the above-described first semiconductor element and the above-described fourth semiconductor element are arranged on the windward side of the above-described cooler heat receiving part, the above-described second semiconductor element and the above-described third semiconductor element are arranged in the middle of the cooling wind direction of the cooler heat receiving part, the above-described first diode and the above-described second diode are arranged on the leeward side of the above-described cooler heat receiving part, the above-described first semiconductor element and the above-described second semiconductor element, as well as the above-described third semiconductor element and the above-described fourth semiconductor element are each arranged in positions opposite to each other in a horizontal direction with respect to a centerline of the above-described cooler heat receiving part in the cooling wind direction, the above-described first diode is arranged on the same side as the above-described second semiconductor element in a horizontal direction with respect to the above-described centerline, and the above-described second diode is arranged on the same side as the above-described third semiconductor element in a horizontal direction with respect to the above-described centerline.

Furthermore, the electric power conversion device of the present invention is such that in the above-described electric power conversion device which radiates heat by self-cooling, the above-described first semiconductor element and the above-described fourth semiconductor element are arranged on the lower side of the cooler heat receiving part in a vertical direction.

Moreover, in the electric power conversion device of the present invention, the semiconductor element groups constituting the above-described power conversion part are arranged in such a manner that orientations of terminals of semiconductor elements arranged in the above-described cooler heat receiving part provide a collector terminal on the windward side and an emitter terminal on the leeward side.

In addition, in the electric power conversion device of the present invention, the semiconductor element groups constituting the above-described power conversion part are arranged in such a manner that the orientations of terminals of semiconductor elements arranged in the above-described cooler heat receiving part are such that in the above-described second semiconductor element and the above-described third semiconductor element, an emitter terminal and a collector terminal are arranged side by side in a direction orthogonal to the cooling wind direction, and in the above-described first semiconductor element and the above-described fourth semiconductor element, an emitter terminal and a collector terminal are arranged side by side facing the cooling wind direction, with one of the emitter terminals of the above-described first semiconductor element and the above-described fourth semiconductor element arranged on the windward side and the other emitter terminal arranged on the leeward side.

Further, the electric power conversion device of the present invention is a dc power source in which a primary winding of a transformer is connected to an ac output terminal of a connection point of the above-described second semiconductor element and the above-described third semiconductor element, to a rectifying diode bridge circuit connected to a secondary winding of the transformer is connected a filter circuit composed of a reactor and a capacitor on the output side of the rectifying diode bridge circuit, and a resonance reactor is provided on the output side of the secondary winding of the transformer, and a resonance switch circuit composed of a semiconductor switch and a resonance capacitor is connected in parallel to the output side of the rectifying diode bridge to form a series resonance circuit of the resonance reactor and the resonance capacitor of the resonance switch circuit, wherein semiconductor element groups are formed from a three-level circuit in such a manner that the heat generation of semiconductor element groups formed as the one unit, is largest in the first semiconductor element and the fourth semiconductor element, second largest in the second semiconductor element and the third semiconductor element, and smallest in the first diode and the second diode.

Figure 1:
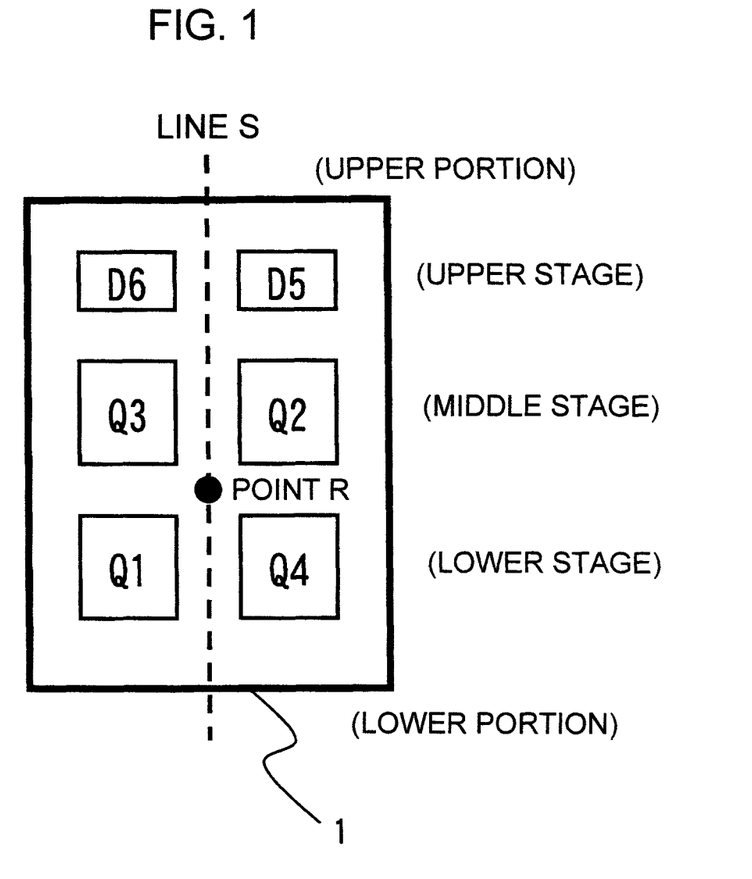
FIG. 1 is a diagram showing an example of the element arrangement of a converter cooler of Embodiment 1 of the present invention.

The electric power conversion device of the present invention is an electric power conversion device in which, as described above, the arrangement of semiconductor element groups in a three-level circuit is as shown in FIG. 1. In the case where forced cooling by wind is performed using a fan and a blower, it is advisable to install the fan and the blower on the lower stage side of a cooler.

In the present invention, semiconductor elements are arranged as described in the above "SUMMARY OF THE INVENTION," whereby in a circuit of three-level configuration, it is possible to suppress the parasitic inductance of the circuit by shortening the distance of a closed circuit of Q1→Q2→Q3→D6 or a closed circuit of Q2→Q3→Q4→D5.

Moreover, in a three-level circuit as shown in FIG. 2, because the heat generation of each element is in decreasing order semiconductor elements Q1, Q4>semiconductor elements Q2, Q3>clamp diodes D5, D6, it is possible to optimize the cooling performance by placing elements of large heat generation on the side where the cooling effect of the cooler is large, and the cooler can be reduced in size. In particular, in a self-cooling type cooler, it is possible to simultaneously realize the maximum utilization of the cooling performance and minimization of the circuit inductance by this arrangement.

Moreover, by adopting a longitudinal three-stage arrangement, it is possible to further reduce the length of the cooler in a direction orthogonal to the cooling wind (lateral width), and in the case where the electric power conversion device is installed under the floor of railroad rolling stock, it is possible to reduce the size of the electric power conversion device.

DETAILED DESCRIPTION OF THE PREFERRED EMBODIMENTS

Embodiments of the present invention will be described below with the aid of the drawings.

FIG. 2 is a diagram showing an example of the electric circuit configuration in the present invention. Four semiconductor elements of a first semiconductor element Q1 to a fourth semiconductor element Q4 are connected in series between a dc positive terminal P and a dc negative terminal N, and a first diode D5 and a second diode D6 are connected in series. A series connection of the first diode D5 and the second diode D6 is connected between a connection point of the first semiconductor element Q1 and the second semiconductor element Q2 and a connection point of the third semiconductor element Q3 and the fourth semiconductor element Q4. A transformer 14 (Tr) is connected between a connection point of the second semiconductor element Q2 and the third semiconductor element Q3 and a connection point of the first diode D5 and the second diode D6. Furthermore, filter capacitors 11 (FC1), 12 (FC2) are connected to between the dc positive terminal P and the dc negative terminal N.

Figure 3:
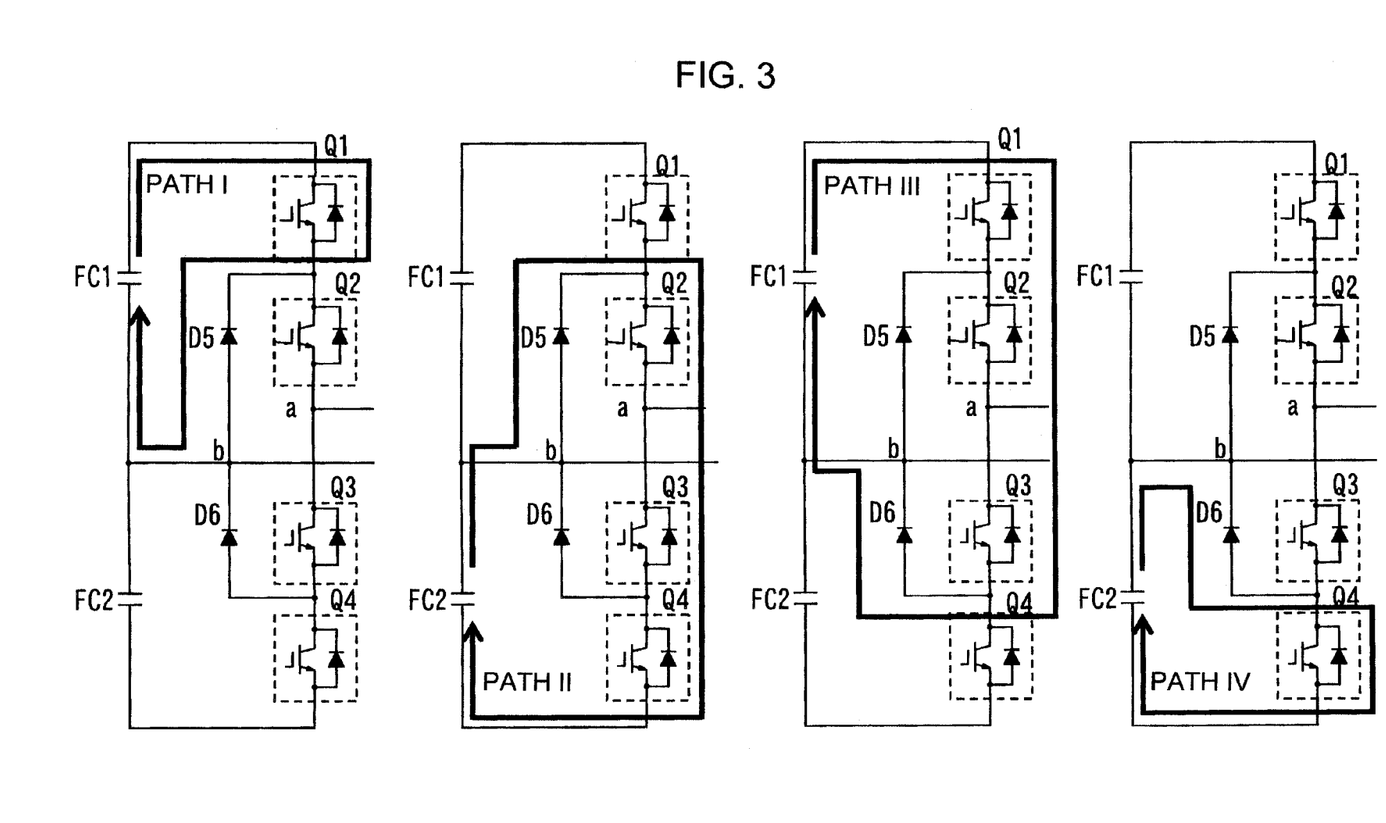
FIG. 3 is a diagram showing a commutating path in the electric circuit configuration in the present invention.
Figure 4:
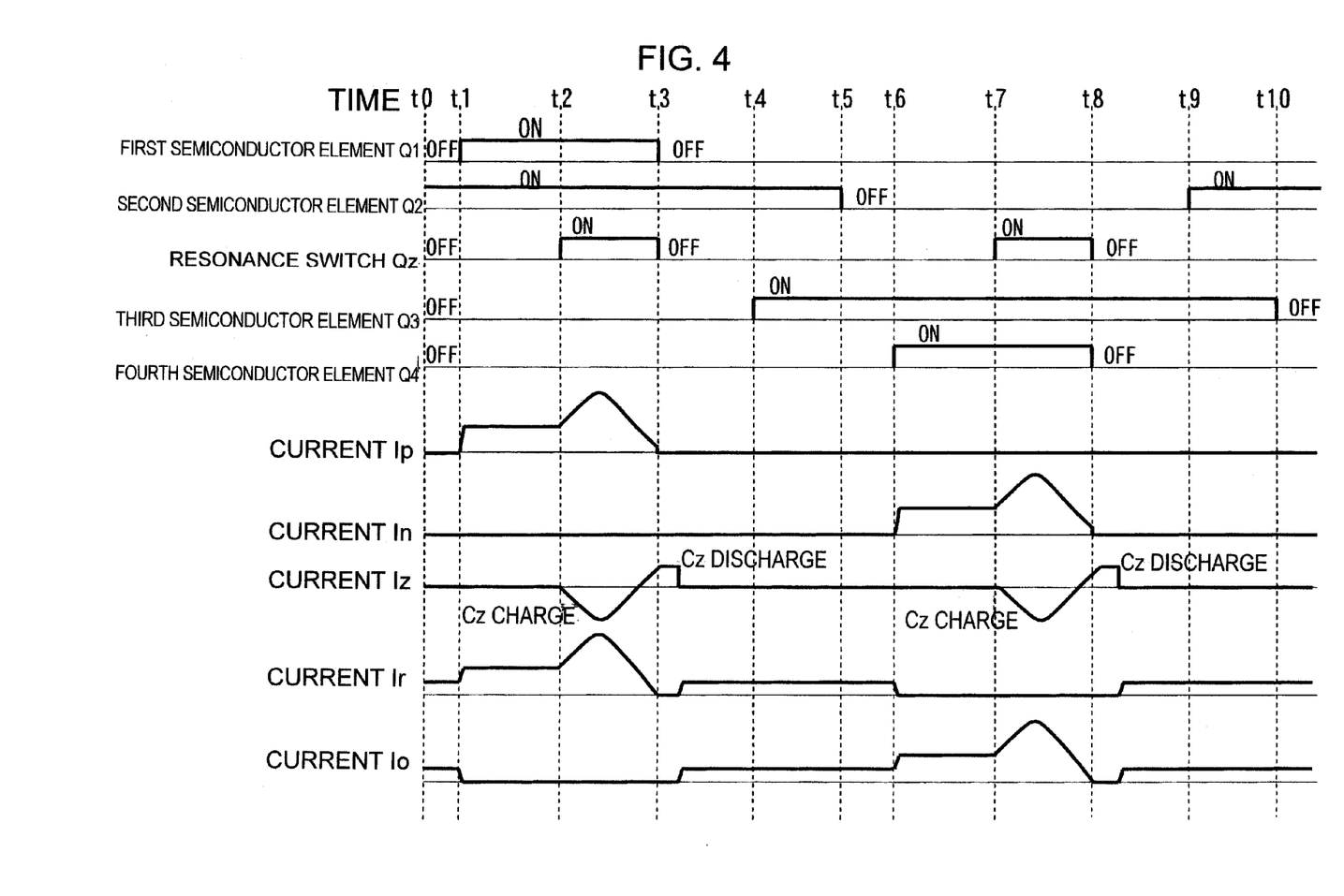
FIG. 4 is a diagram showing an operation timing chart of the electric circuit configuration in the present invention.

The operation of this circuit will be described below with the aid of FIG. 4 showing an operation timing chart and FIG. 3 showing commutating paths.

At time t0 the semiconductor element Q1 is in an off state and Q2 is in an on state. From this state, at time t1 the semiconductor element Q1 is turned on and a current Ip flows through the semiconductors Q1, Q2. At this time, a current Ir flows through diodes D21, D24 of the rectifying circuit 15.

At time t2 the resonance switch Qz is turned on. As a result of this, the resonance current Iz is caused to flow by the resonance reactor Lz and the resonance capacitor Cz, and the resonance capacitor Cz is charged. As a result of this resonance action, the current Ip flowing through the semiconductor switches Q1, Q2 and the current flowing through the diodes D21, D24 also increase.

At time t3 the resonance capacitor Cz is in a discharge state, and at this time the load current Id is being supplied from the resonance circuit 21 and no current flows through the diodes D21, D24. Furthermore, the current Ip flowing through the semiconductor elements Q1, Q2 is the exciting current of the transformer Tr. When in this state the semiconductor element Q1 is turned off, a switching loss caused by this turning-off is generated in the semiconductor element Q1.

Now, when this semiconductor element Q1 is turned off, the load current which has flown up to that time through the path from the positive side terminal of filter capacitor FC1→semiconductor element Q1→semiconductor element Q2→point a→Tr→point b→the negative side terminal of filter capacitor FC1 (this path is referred to as path (i-a)) decreases and a current which has commutated to the path from transformer Tr→point b→clamp diode D5→semiconductor Q2→point a→transformer Tr (this path is referred to as path (i-b)) increases. The total circuit inductance of path (i-a) and path (i-b) is the circuit inductance of PATH I of FIG. 3. If the inductance of this circuit is expressed by Li, from the rate of change of current di/dt of path (i-a) and path (i-b), the induced voltage V at the turning-off of the semiconductor element Q1 is V=Li×di/dt, and it follows that the voltage obtained by the addition of this induced voltage V to the voltage of the capacitor FC1 is applied to the semiconductor element Q1.

At time t4 the semiconductor element Q3 is turned off. At this time in the state of completion of discharge from the resonance capacitor Cz, the load current Id which has returned is flowing through the diodes D21 to D24 of the rectifying circuit 15.

At time t5 the semiconductor element Q2 is turned off. During normal operation, the current flowing through Q2 is almost zero since only a small amount of current which returns by the commutation flows and, therefore, switching losses are a minimum. For this reason, switching losses which might be generated at the turning-off of the semiconductor element Q1 are not generated and there is a difference in loss between the semiconductor Q1 and the semiconductor element Q2, with the result that a difference occurs also in calorific value.

Furthermore, at this time the current which has returned by the path from transformer Tr→point b→clamp diode D5→semiconductor element Q2→point a→transformer Tr (this path is referred to as path (ii-a)) decreases, and the current which has commutated to the path from the negative side terminal of capacitor FC2→flywheel diode of semiconductor element Q4→flywheel diode of semiconductor element Q3→point a→transformer Tr→point b→the positive side terminal of filter capacitor FC2 (this path is referred to as path (ii-b)) increases.

The total circuit inductance of these path (ii-a) and path (ii-b) is the inductance of PATH II of FIG. 3. If the inductance of this circuit is expressed by Li, from the rate of change of current di/dt of path (ii-a) and path (ii-b), the induced voltage V at the turning-off of the semiconductor element Q2 is V=Li×di/dt, and it follows that the voltage obtained by the addition of this induced voltage V to the voltage of the filter capacitor FC2 is applied to the semiconductor element Q2.

Because the current is almost zero at the turning-off of the semiconductor element Q2 during normal operation, there is no very serious problem so long as usual usage is concerned. However, in the case where the semiconductor element Q2 is turned off from a conducting state due to a protecting action at abnormal time and the like, the induced voltage which is generated becomes large and hence it is necessary to pay attention also to the inductance of PATH II.

At time t6 the semiconductor element Q4 is turned on and the current In flows through the semiconductor elements Q3, Q4. At this time the current Io flows through the diodes D22, D23 of the rectifying circuit 15.

At time t7 the resonance switch Qz is turned on. As a result of this, the resonance current Iz is caused to flow by the resonance reactor Lz and the resonance capacitor Cz and the resonance capacitor Cz is charged. As a result of this resonance action, the current In flowing through the semiconductor switches Q3, Q4 and the current flowing through the diodes D22, D23 also increase.

At time t8 the resonance capacitor Cz is in a discharge state, and at this time the load current is being supplied from the resonance circuit 21 and no current flows through the diodes D22, D23. Furthermore, at this time the current In flowing through the semiconductor elements Q3, Q4 is the exciting current of the transformer Tr. When in this state the semiconductor element Q4 is turned off, a switching loss caused by this turning-off is generated in the semiconductor element Q4.

When this semiconductor element Q4 is turned off, the load current which has flown up to that time in the path from the positive side terminal of filter capacitor FC2→point b→transformer Tr→point a→semiconductor element Q3→semiconductor element Q4→the negative side terminal of filter capacitor FC2 (this path is referred to as path (iv-a)) decreases and a current which has commutated to the path from transformer Tr→point a→semiconductor element Q3→clamp diode D6→point b→transformer Tr (this path is referred to as path (iv-b)) increases.

The total circuit inductance of these path (iv-a) and path (iv-b) is the circuit inductance of PATH IV of FIG. 3. If the inductance of this circuit is expressed by Li, from the rate of change of current di/dt of path (iv-a) and path (iv-b), the induced voltage V at the turning-off of the semiconductor element Q4 is V=Li×di/dt, and the voltage obtained by the addition of this induced voltage V to the voltage of the filter capacitor FC2 is applied to the semiconductor element Q4.

At time t9 the semiconductor element Q2 is turned off. At this time in the state of completion of discharge from the resonance capacitor Cz, the load current Id which has returned is flowing through the diodes D21 to D24 of the rectifying circuit 15.

At time t10 the semiconductor element Q3 is turned off. During normal operation, the current flowing through Q3 is only a small amount of current which returns by the commutation and is almost zero and, therefore, switching losses are a minimum. For this reason, switching losses which might be generated at the turning-off of the semiconductor element Q4 are not generated and there is a difference in loss between the semiconductor element Q3 and the semiconductor element Q4, with the result that a difference occurs also in calorific value.

Furthermore, at this time the current which has returned by the path from transformer Tr→point a→semiconductor element Q3→clamp diode D6→point b→transformer Tr (this path is referred to as path (iii-a)) decreases, and the current which has commutated to the path from the negative side terminal of filter capacitor FC1→point b→transformer Tr→point a→flywheel diode of semiconductor element Q2→flywheel diode of semiconductor element Q1→the positive side terminal of filter capacitor FC1 (this path is referred to as path (iii-b)) increases.

The total circuit inductance of these path (iii-a) and path (iii-b) is the inductance of PATH III of FIG. 3. If the inductance of this circuit is expressed by Li, from the rate of change of current di/dt of path (iii-a) and path (iii-b), the induced voltage V at the turning-off of the semiconductor element Q2 is V=Li×di/dt, and the voltage obtained by the addition of this induced voltage V to the voltage of the filter capacitor FC1 is applied to the semiconductor element Q3.

Because the current is almost zero at the turning-off of the semiconductor element Q3 during normal operation, there is no very serious problem so long as usual usage is concerned. However, in the case where the semiconductor element Q3 is turned off from a conducting state due to a protecting action at abnormal time and the like, the induced voltage which is generated becomes large and hence it is necessary to pay attention also to the inductance of PATH III.

If, in the above-described operation, the voltage at the turning-off of the semiconductor elements Q1 to Q4 is excessive, then the breakdown voltage of the semiconductor elements may sometimes be exceeded, resulting in element breakage. This voltage can be reduced by reducing the circuit inductance Li of PATH I to PATH IV of FIG. 3 above.

The circuit inductance Li of a path can be reduced by minimizing the wiring length of the path or by providing going and returning paths which are close to each other as the current path and canceling magnetic fields generated by currents flowing in the going and returning paths. Among PATH I to PATH IV, in particular, the path length is large in PATH II and PATH III and the inductance is large. Therefore, it is necessary to minimize the distance of these paths.

Furthermore, there is a difference between the heat generation due to generated losses in the semiconductor elements Q1 to Q4 and heat generation due to generated losses in the clamp diodes D5, D6, and the magnitude of heat generation is in decreasing order semiconductor switches Q1, Q4>semiconductor switches Q2, Q3>clamp diodes D5, D6. For this reason, the cooler 1 is required to be able to provide efficient cooling against this variation in heat generation.

Embodiment 1

FIG. 1 shows Embodiment 1 of an element arrangement method in the cooler 1 for semiconductor element groups in which the distances of PATH II and PATH III of FIG. 3 are minimized and the semiconductor element groups can be cooled with good efficiency. This arrangement method will be described below.

Semiconductor elements Q1 to Q4 and D5, D6 constituting an electric power conversion part are formed as one unit and semiconductor element groups constituting one unit are installed in a cooler 1 which is arranged perpendicular to a horizontal surface and in a vertical direction under the floor of railroad rolling stock, and the semiconductor element groups are adapted to radiate heat by self-cooling (convection of air generated by the ascent of heated air). The arrangement method of elements in the cooler 1 is such that, as shown in FIG. 1, on the same plane surface of the cooler 1 arranged in the vertical direction, the first semiconductor element Q1 and the fourth semiconductor element Q4 are arranged on the lower side of the heat receiving part, the second semiconductor element Q2 and the third semiconductor element Q3 are arranged in the middle of the heat receiving part, and the first diode D5 and the second diode D6 are arranged on the upper side of the heat receiving part.

Furthermore, the first semiconductor element Q1 and the second semiconductor element Q2, as well as the third semiconductor element Q3 and the fourth semiconductor element Q4 are each arranged in positions opposite to each other in a horizontal direction with respect to a centerline (line S) of the cooler 1 in a vertical direction, i.e., in positions crossing point R, the first diode D5 is arranged on the same side as the second semiconductor element Q2 in a horizontal direction with respect to the above-described centerline (line S), and the second diode D6 is arranged on the same side as the third semiconductor element Q3 in a horizontal direction with respect to the above-described centerline (line S). Plate-like conductors are used to connect each semiconductor element group. By connecting the semiconductor element groups in such a manner as to cause a going path current and a returning path current to be close to each other by superposing the plate-like conductors, it is possible to reduce the inductance to ensure that magnetic fields are canceled by the going path current and the returning path current.

With this element arrangement, in particular, in a self-cooling type cooler 1, it is possible to improve the efficiency of the cooler 1. Because warm air ascends and cold air descends, in the self-cooling type cooler 1, elements having large heat generation are arranged on the lower side of the cooler and elements having small heat generation are arranged on the upper side of the cooler 1. Although the elements arranged on the upper side are warmed by the heat generation of the elements arranged on the lower side, the elements arranged on the upper side have small heat generation. Hence as a result of this, the heat is made uniform in the whole cooler 1 and it is possible to achieve cooling with good efficiency. In the case where forced cooling by wind is performed using a fan and a blower, it is advisable to install the fan and the blower on the lower stage side of the cooler 1 and to feed the cooling wind from the lower stage side. In the case where forced cooling by wind is performed by causing the wind to flow laterally using a fan and a blower, the cooler 1 shown in FIG. 1 is installed by being turned 90 degrees either rightward or leftward and the cooling wind is fed from the direction in which the first semiconductor element Q1 and the fourth semiconductor element Q4 are arranged.

Figure 5:
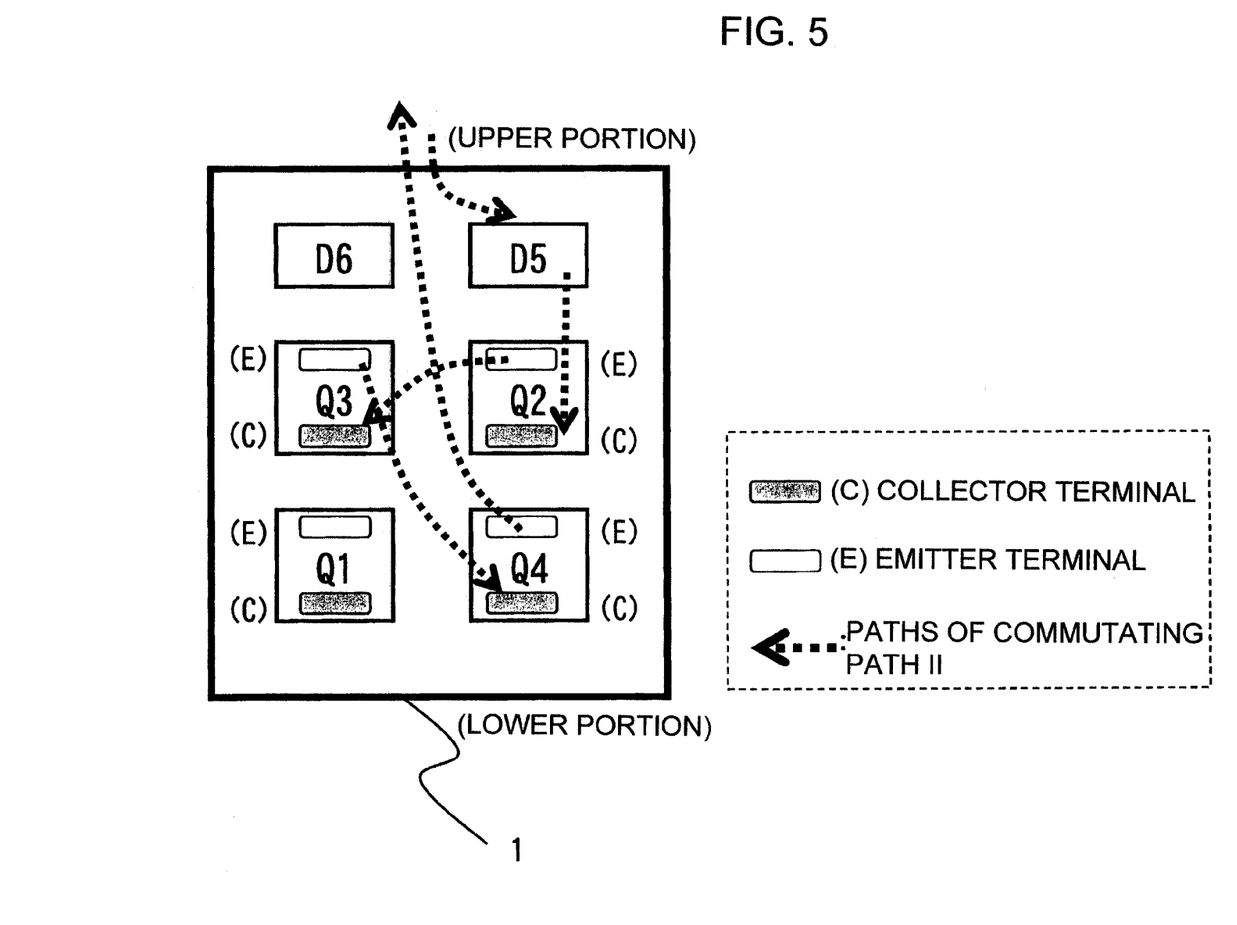
FIG. 5 is a diagram showing an example of the commutating path on the element arrangement of the converter cooler of Embodiment 1 of the present invention.

In the conventional technique, as indicated by the thick arrows of FIG. 11, the distance of the current path of PATH II is long. However, it is possible to accomplish the shortest wiring, and as indicated by the thick arrows of FIG. 5, it is possible to shorten the distance of PATH II. Also for PATH III, it is possible to shorten the distance in the same manner as PATH II.

Furthermore, because the semiconductor element groups are arranged in three stages in the vertical direction, this configuration enables the lateral dimension of the cooler 1 (the length dimension in a direction orthogonal to the cooling wind) to be reduced. The electric power conversion device can be reduced in size and in the case where the electric power conversion device is installed under the floor of railroad rolling stock, it is possible to reduce the size in the rail direction.

In this embodiment, the description was given of the example in which three-level semiconductor element groups are used to form a converter circuit of a DC-DC converter in which switching losses are reduced using a resonance circuit. However, when a similar three-level circuit is formed by a converter which converts an alternate current to a direct current, a VVVF inverter circuit which converts a direct current to an alternate current, and the like, even in the case where the heat generation of semiconductor element groups has heat generation variations as described in this embodiment, it is possible to reduce the inductance and to ensure efficient cooling performance by arranging elements in the cooler 1 as shown in this embodiment.

Embodiment 2

Figure 6:
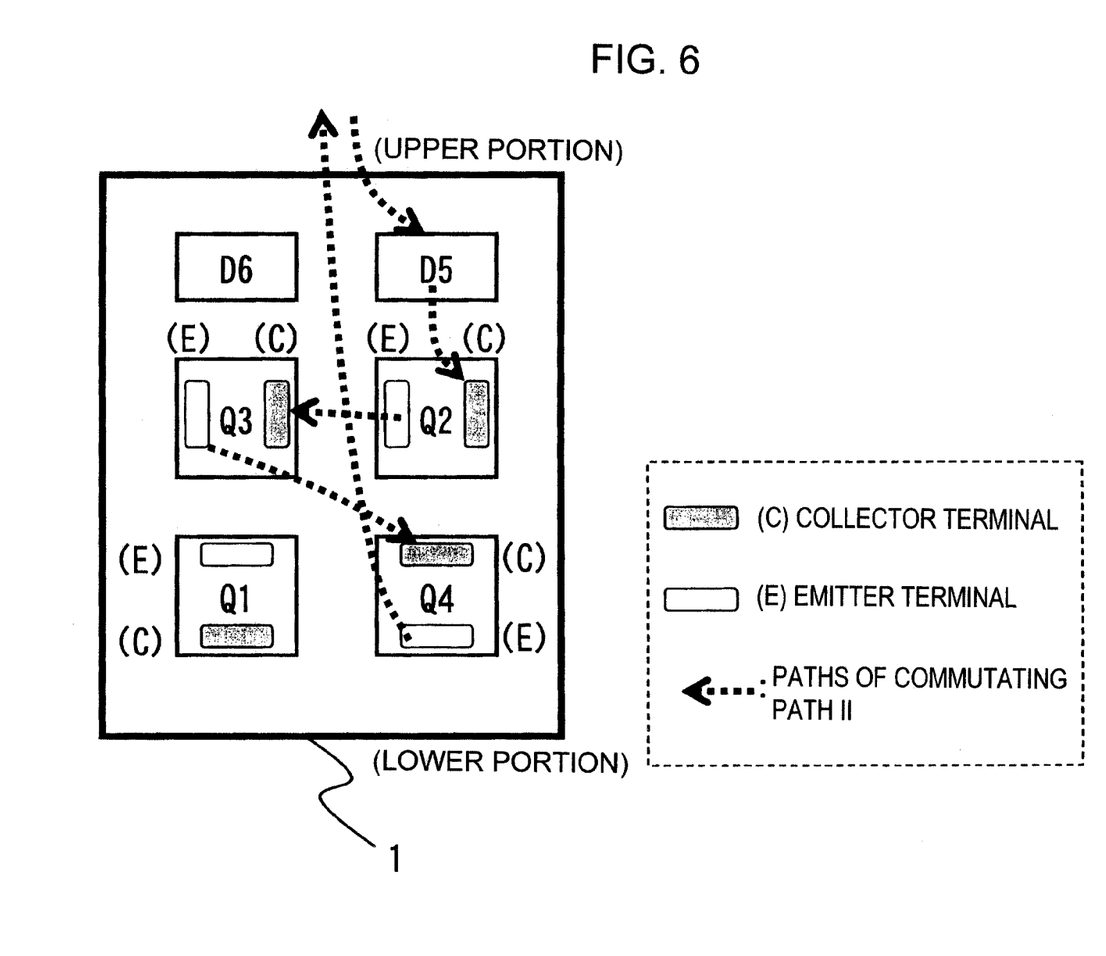
FIG. 6 is a diagram showing the commutating path on the element arrangement of the converter cooler of Embodiment 2 of the present invention.

FIG. 6 shows Embodiment 2 of an element arrangement method in the cooler 1 for semiconductor element groups in which the distances of PATH II and PATH III of FIG. 3 are minimized and the semiconductor element groups can be cooled with good efficiency. The thick arrows in FIG. 6 indicate the commutating paths of PATH II of FIG. 3.

This element arrangement method differs from the arrangement method of FIG. 1 described in Embodiment 1 in that the orientations of the emitter terminals or collector terminals of the semiconductor elements Q1 to Q4 are different. As shown in FIG. 6, the semiconductor element Q1 and the semiconductor element Q4 which are arranged in the lower stage are arranged to provide orientations which are different 180 degrees from each other. That is, in this example, the semiconductor element Q1 is arranged in such a manner that the collector terminal is present on the lower side of the cooler 1 and the semiconductor element Q4 is arranged in such a manner that the collector terminal is present on the upper side of the cooler 1.

Furthermore, the semiconductor element Q2 and the semiconductor element Q3 are arranged to provide orientations which are different 90 degrees from the semiconductor element Q1 and the semiconductor element Q4, and the semiconductor element Q2 and the semiconductor element Q3 are arranged to provide the same orientation. That is, the emitter elements and the collector elements are arranged in orientations orthogonal to the cooling wind direction. In this example, the semiconductor element Q2 and the semiconductor element Q3 are arranged in such a manner that the collector terminals are present on the right side of the cooler and the emitter terminals are present on the left side of the cooler. In this manner, Embodiment 2 is an example in which the semiconductor elements are arranged to provide different orientations.

Such element arrangements as described above enable magnetic fields to be canceled by a going path current and a returning path current and the wiring distance to be further shortened, and it is possible to further reduce the inductance of a circuit.

What is claimed is:

1. An electric power conversion device in which semiconductor element groups constituting an electric power conversion part are formed as one unit; a main circuit of the electric power conversion part is such that four semiconductor elements of a first semiconductor element to a fourth semiconductor element are connected in series between a dc positive terminal and a dc negative terminal, and a first diode and a second diode are connected in series; an ac terminal is connected to a connection point of a second semiconductor element and a third semiconductor element and a neutral terminal is connected to a connection point of the first diode and the second diode; the first diode is connected to a connection point of the first semiconductor element and the second semiconductor element and the second diode is connected to a connection point of the third semiconductor element and the fourth semiconductor element; and the semiconductor element groups constituting the one unit are mounted on a cooler heat receiving part on the same plane and are adapted to radiate heat by self-cooling or forced cooling by wind, wherein the first semiconductor element and the fourth semiconductor element are arranged on the windward side of the cooler heat receiving part, the second semiconductor element and the third semiconductor element are arranged in the middle of the cooling wind direction of the cooler heat receiving part, the first diode and the second diode are arranged on the leeward side of the cooler heat receiving part, the first semiconductor element and the second semiconductor element, as well as the third semiconductor element and the fourth semiconductor element are each arranged in positions opposite to each other in a horizontal direction with respect to a centerline of the cooler heat receiving part in the cooling wind direction, the first diode is arranged on the same side as the second semiconductor element in a horizontal direction with respect to the centerline, and the second diode is arranged on the same side as the third semiconductor element in a horizontal direction with respect to the centerline.

2. The electric power conversion device according to claim 1, wherein in the electric power conversion device which radiates heat by self-cooling, the first semiconductor element and the fourth semiconductor element are arranged on the lower side of the cooler heat receiving part in a vertical direction.

3. The electric power conversion device according to claim 2, wherein the semiconductor element groups constituting the power conversion part are arranged in such a manner that orientations of terminals of semiconductor elements arranged on the cooler heat receiving part provide a collector terminal on the windward side and an emitter terminal on the leeward side.

4. The electric power conversion device according to claim 2, wherein the semiconductor element groups constituting the power conversion part are arranged in such a manner that orientations of terminals of semiconductor elements arranged on the cooler heat receiving part are such that in the second semiconductor element and the third semiconductor element, an emitter terminal and a collector terminal are arranged side by side in a direction orthogonal to the cooling wind direction, and in the first semiconductor element and the fourth semiconductor element, an emitter terminal and a collector terminal are arranged side by side facing the cooling wind direction, with one of the emitter terminals of the first semiconductor element and the fourth semiconductor element arranged on the windward direction and the other emitter terminal arranged on the leeward direction.

5. The electric power conversion device according to claim 1, wherein the electric power conversion device is a dc power source in which a primary winding of a transformer is connected to an alternating current output terminal of a connection point of the second semiconductor element and the third semiconductor element, to a rectifying diode bridge circuit connected to a secondary winding of the transformer is connected a filter circuit composed of a reactor and a capacitor on the output side of the rectifying diode bridge circuit, and a resonance reactor is provided on the output side of the secondary winding of the transformer, and a resonance switch circuit composed of a semiconductor switch and a resonance capacitor is connected in parallel to the output side of the rectifying diode bridge to form a series resonance circuit of the resonance reactor and the resonance capacitor of the resonance switch circuit, wherein the semiconductor element groups are formed from a three-level circuit in such a manner that the heat generation of semiconductor element groups formed as the one unit, is largest in the first semiconductor element and the fourth semiconductor element, second largest in the second semiconductor element and the third semiconductor element, and smallest in the first diode and the second diode.

\* \* \* \* \*